(12) United States Patent
Takagi et al.

(10) Patent No.: US 10,950,469 B2
(45) Date of Patent: Mar. 16, 2021

(54) SEMICONDUCTOR MANUFACTURING APPARATUS AND METHOD OF MANUFACTURING SEMICONDUCTOR DEVICE

(71) Applicant: TOSHIBA MEMORY CORPORATION, Minato-ku (JP)

(72) Inventors: Jun Takagi, Yokkaichi (JP); Shinichi Hirasawa, Mie (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 446 days.

(21) Appl. No.: 16/032,285

(22) Filed: Jul. 11, 2018

(65) Prior Publication Data

US 2019/0287826 A1 Sep. 19, 2019

(30) Foreign Application Priority Data

Mar. 15, 2018 (JP) .............................. JP2018-047945

(51) Int. Cl.
| | | |
|---|---|---|
| *B24B 37/00* | (2012.01) | |
| *H01L 21/67* | (2006.01) | |
| *B24B 37/015* | (2012.01) | |
| *B24B 37/04* | (2012.01) | |
| *B24B 37/20* | (2012.01) | |
| *B24B 57/02* | (2006.01) | |
| *B24B 37/10* | (2012.01) | |

(52) U.S. Cl.
CPC ...... *H01L 21/67092* (2013.01); *B24B 37/015* (2013.01); *B24B 37/042* (2013.01); *B24B 37/107* (2013.01); *B24B 37/20* (2013.01); *B24B 57/02* (2013.01)

(58) Field of Classification Search
CPC ... B24B 37/015; B24B 37/042; B24B 37/107; B24B 37/20; B24B 57/02; H01L 21/67092
USPC .............................................. 451/7, 53, 449
See application file for complete search history.

(56) References Cited

U.S. PATENT DOCUMENTS

| | | | | |
|---|---|---|---|---|
| 5,127,196 A | * | 7/1992 | Morimoto | ............ B24B 37/107 |
| | | | | 257/E21.244 |
| 5,364,655 A | * | 11/1994 | Nakamura | ............ B24B 37/08 |
| | | | | 427/128 |
| 5,775,980 A | * | 7/1998 | Sasaki | .................. B24B 37/015 |
| | | | | 257/E21.304 |

(Continued)

FOREIGN PATENT DOCUMENTS

| | | |
|---|---|---|
| JP | 9-131661 | 5/1997 |
| JP | 2005-271151 | 10/2005 |

(Continued)

*Primary Examiner* — George B Nguyen
(74) *Attorney, Agent, or Firm* — Oblon, McClelland, Maier & Neustadt, L.L.P.

(57) ABSTRACT

In one embodiment, a semiconductor manufacturing apparatus includes a polishing table configured to hold a polishing pad, a polishing head configured to hold a substrate to be polished by the polishing pad, and a polishing liquid feeder configured to feed a polishing liquid to the polishing pad. The apparatus further includes a heat exchanger configured to be placed on the polishing pad and control temperatures of the polishing pad and the polishing liquid, and one or more protruding portions provided on a side face or a bottom face of the heat exchanger.

20 Claims, 8 Drawing Sheets

(56) References Cited

U.S. PATENT DOCUMENTS

| | | | |
|---|---|---|---|
| 5,866,480 A | 2/1999 | Murakami et al. | |
| 6,206,760 B1 * | 3/2001 | Chang | B24B 37/04 451/41 |
| 6,638,141 B2 * | 10/2003 | Ide | B24B 37/013 451/285 |
| 6,749,484 B2 * | 6/2004 | Yang | B24B 37/32 451/286 |
| 7,837,534 B2 | 11/2010 | Aiyoshizawa et al. | |
| 9,782,870 B2 | 10/2017 | Maruyama et al. | |
| 2001/0055940 A1 * | 12/2001 | Swanson | B24B 37/015 451/53 |
| 2004/0087248 A1 * | 5/2004 | Hirokawa | B24B 37/015 451/7 |
| 2005/0221724 A1 | 10/2005 | Terada et al. | |
| 2011/0159782 A1 * | 6/2011 | Sone | B24B 37/015 451/7 |
| 2012/0220195 A1 * | 8/2012 | Gawase | B24B 37/015 451/7 |
| 2012/0220196 A1 * | 8/2012 | Maruyama | B24B 37/04 451/7 |
| 2013/0045596 A1 | 2/2013 | Eda et al. | |
| 2014/0273753 A1 * | 9/2014 | Matsuo | B24B 49/12 451/6 |
| 2015/0079881 A1 | 3/2015 | Maruyama et al. | |
| 2015/0231760 A1 | 8/2015 | Maruyama et al. | |
| 2017/0106492 A1 | 4/2017 | Motoshima | |
| 2018/0290263 A1 * | 10/2018 | Sotozaki | B24B 49/14 |
| 2019/0375071 A1 * | 12/2019 | Peng | H01L 21/3212 |

FOREIGN PATENT DOCUMENTS

| | | |
|---|---|---|
| JP | 2008-307630 | 12/2008 |
| JP | 4902433 | 3/2012 |
| JP | 2013-42066 | 2/2013 |
| JP | 2014-188596 | 10/2014 |
| JP | 2015-155128 | 8/2015 |
| JP | 2017-77591 | 4/2017 |
| JP | 6161999 | 7/2017 |
| JP | 2017-193048 | 10/2017 |

* cited by examiner

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2018-047945, filed on Mar. 15, 2018, the entire contents of which are incorporated herein by reference.

FIELD

Embodiments described herein relate to a semiconductor manufacturing apparatus and a method of manufacturing a semiconductor device.

BACKGROUND

In some cases, a CMP (chemical mechanical polishing) apparatus for polishing a wafer includes a heat exchanger for controlling temperatures of a polishing pad and a polishing liquid (slurry). In these cases, entry of the polishing liquid into an area between the polishing pad and the heat exchanger is desired, but how to cause the entry of the polishing liquid is a problem.

DETAILED DESCRIPTION

Figure 1:
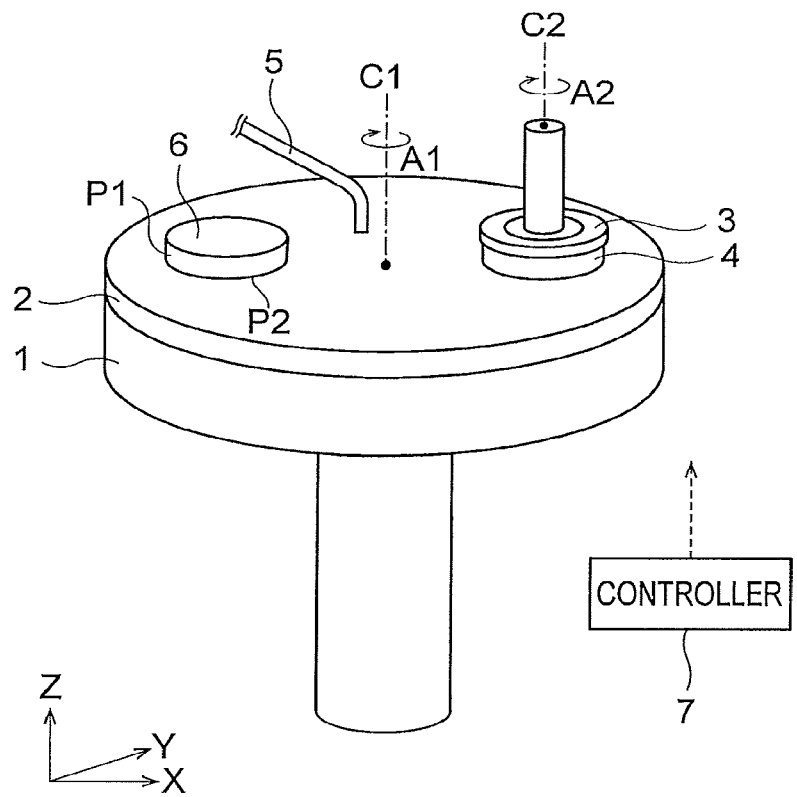
FIG. 1 is a perspective view showing the structure of a semiconductor manufacturing apparatus of a first embodiment.

Embodiments will now be explained with reference to the accompanying drawings. Throughout FIGS. 1 to 12, identical or similar components are denoted by the same reference numerals and an overlapping explanation thereof is omitted.

In one embodiment, a semiconductor manufacturing apparatus includes a polishing table configured to hold a polishing pad, a polishing head configured to hold a substrate to be polished by the polishing pad, and a polishing liquid feeder configured to feed a polishing liquid to the polishing pad. The apparatus further includes a heat exchanger configured to be placed on the polishing pad and control temperatures of the polishing pad and the polishing liquid, and one or more protruding portions provided on a side face or a bottom face of the heat exchanger.

First Embodiment

FIG. 1 is a perspective view of the structure of a semiconductor manufacturing apparatus of a first embodiment.

The semiconductor manufacturing apparatus in FIG. 1 includes a polishing table 1 holding a polishing pad 2, a polishing head 3 that holds a wafer 4, a slurry feeder 5 that supplies slurry, a heat exchanger 6, and a controller 7. The wafer 4 is one example of the substrate. The slurry is one example of the polishing liquid. The semiconductor manufacturing apparatus in FIG. 1 is a CMP apparatus for polishing the wafer 4 by the polishing pad 2 on which the slurry is fed.

FIG. 1 shows an X direction and a Y direction which are parallel to the upper face of the polishing pad 2 and which are orthogonal to each other, and shows a Z direction which is orthogonal to the upper face of the polishing pad 2. Herein, the +Z direction is defined as the upward direction and the −Z direction is defined as the downward direction. However, the −Z direction may coincide with the gravity direction or may not coincide with the gravity direction.

The polishing table 1 rotates the polishing pad 2 about a rotation axis C1, as indicated by arrow A1. The polishing head 3 rotates the wafer 4 about a rotation axis C2, as indicated by arrow A2. The slurry feeder 5 supplies the slurry to the upper face of the polishing pad 2. In the semiconductor manufacturing apparatus in FIG. 1, the slurry is fed to the upper face of the polishing pad 2, the polishing pad 2 and the wafer 4 are rotated, and the lower face of the wafer 4 is pressed against the upper face of the polishing pad 2. As a result, the wafer 4 is polished by the polishing pad 2 on which the slurry is fed.

The heat exchanger 6 held by an arm (not illustrated), is placed on the polishing pad 2 by the arm. The heat exchanger 6 controls the temperature of the polishing pad 2 and the temperature of the slurry on the polishing pad 2 by heating the polishing pad 2 and the slurry. The heat exchanger 6 of the present embodiment has a substantially disc-like shape. Reference character P1 denotes a side face of the heat exchanger 6. Reference character P2 denotes the bottom face of the heat exchanger 6.

For example, in a case where a metallic layer provided on the wafer 4 is to be polished, the temperature of the polishing pad 2 and the temperature of the slurry are kept constant by means of the heat exchanger 6 during a polishing process. Accordingly, the polishing rate to the metallic layer can be improved. Here, if the slurry does not sufficiently enter an area between the upper face of the polishing pad 2 and the bottom face P2 of the heat exchanger 6, a problem that the temperature of the polishing pad 2 and the temperature of the slurry cannot be efficiently controlled, is caused. Polishing of a metallic layer is often carried out to manufacture a three-dimensional memory from the wafer 4, for example.

The aforementioned problem is easily caused when the number of rotations (rotation speed) of the polishing table 1 is low, for example. When the number of rotations of the polishing table 1 is low, a liquid pool of the slurry easily occurs at the upstream from the heat exchanger 6 so that the slurry is likely to flow near the side face P1 of the heat exchanger 6 without entering the area between the polishing pad 2 and the heat exchanger 6. As a result, the temperature of the polishing pad 2 and the temperature of the slurry cannot be efficiently controlled, and the efficiency of polishing the wafer 4 is deteriorated. A countermeasure for this problem is described later.

The controller 7 controls various operations of the semiconductor manufacturing apparatus. For example, the controller 7 controls operations of the polishing table 1, the polishing head 3, the slurry feeder 5, the heat exchanger 6, and the arm for the heat exchanger 6. Examples of the controller 7 include a processor, an electric circuit, and a computer.

Figures 2A, 2B, 2C:
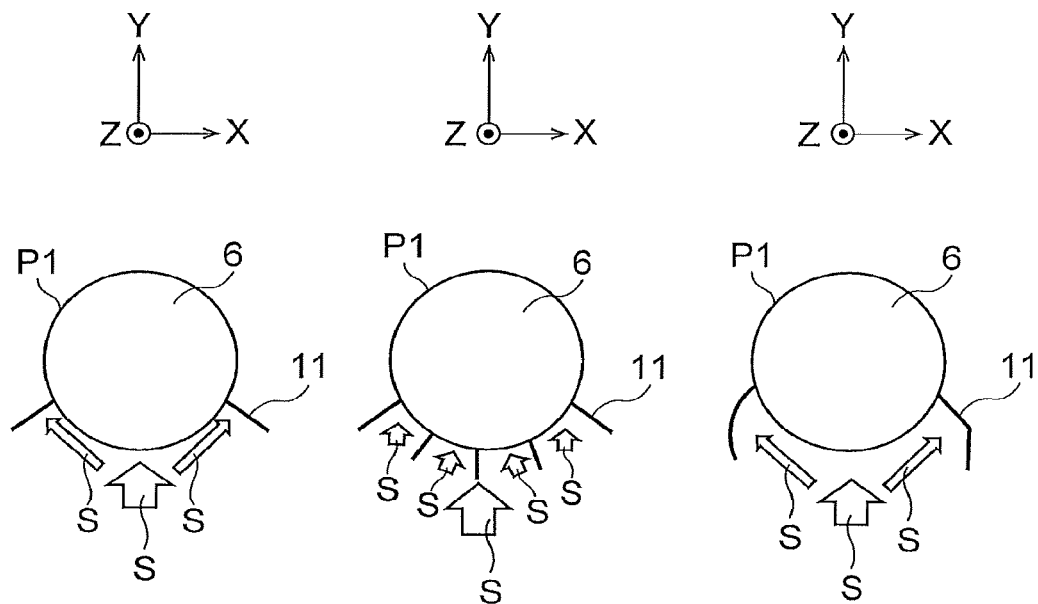
FIGS. 2A to 2C are top views showing structural examples of a heat exchanger of the first embodiment.

FIGS. 2A to 2C are top views showing structural examples of the heat exchanger 6 of the first embodiment.

The semiconductor manufacturing apparatus of the present embodiment includes one or more partition portions 11 which are provided on the side face P1 of the heat exchanger 6, as shown in FIG. 2A. Each of the partition portions 11 is an example of the protruding portion, and laterally protrudes from the side face P1 of the heat exchanger 6. Arrow S indicates the flow direction of the slurry near the side face P1 of the heat exchanger 6.

In order to control the flow of the slurry, the partition portions 11 of the present embodiment are provided at positions to come into contact with the slurry fed to the polishing pad 2. Accordingly, the partition portions 11 each function as a partition with which the flow of the slurry collides. The partition portions 11 each have a shape linearly extending from the side face P1 of the heat exchanger 6, but may have any other shape.

When the number of rotations of the polishing table 1 is low, the slurry is likely to flow along the side face P1 of the heat exchanger 6, as indicated by arrows S. In this case, without the partition portions 11 on the side face P1 of the heat exchanger 6, the slurry might not enter the area between the polishing pad 2 and the heat exchanger 6 but flow from the upstream side to the downstream side of the heat exchanger 6 by bypassing the heat exchanger 6. However, according to the present embodiment, a flow of the slurry collides with the partition portions 11 so that the slurry easily enters the area between the polishing pad 2 and the heat exchanger 6. Consequently, the temperature of the polishing pad 2 and the temperature of the slurry can be efficiently controlled.

In FIG. 2A, two partition portions 11 are provided on the heat exchanger 6. However, two or more partition portions 11 may be provided on the heat exchanger 6, as shown in FIG. 2B. Each of the partition portions 11 in FIGS. 2A and 2B has a planar shape of a straight line. However, each of the partition portions 11 may have a planar shape of a curved line or bent line, as shown in FIG. 2C.

Figure 3A:
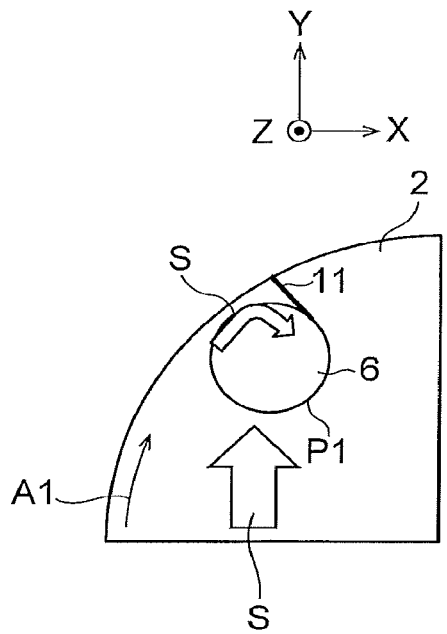
FIGS. 3A and 3B are top views for explaining operation of the semiconductor manufacturing apparatus of the first embodiment.
Figure 3B:
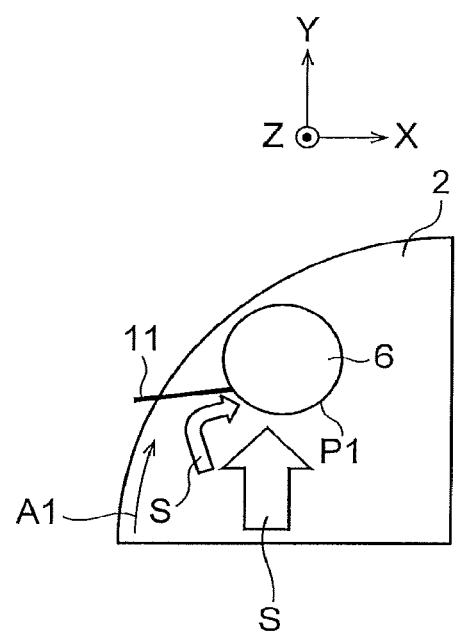

FIGS. 3A and 3B are top views for explaining operation of the semiconductor manufacturing apparatus of the first embodiment.

Arrow S in each of FIGS. 3A and 3B indicates in detail a flow change of the slurry caused by the partition portion 11. In FIG. 3A, the slurry flowing near the side face P1 of the heat exchanger 6 collides with the partition portion 11, and thereby flows into the space between the polishing pad 2 and the heat exchanger 6. In FIG. 3B, the slurry flowing apart from the side face P1 of the heat exchanger 6 collides with the partition portion 11, and thereby flows toward the side face P1 of the heat exchanger 6. Thereafter, the slurry flows into the space between the polishing pad 2 and the heat exchanger 6.

Figure 4A:
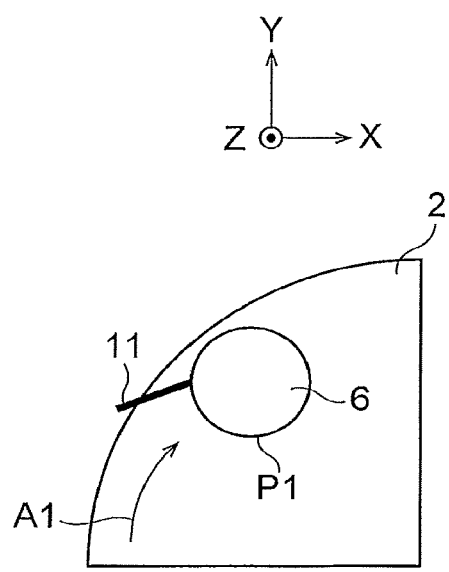
FIGS. 4A and 4B are other top views for explaining operation of the semiconductor manufacturing apparatus of the first embodiment.
Figure 4B:
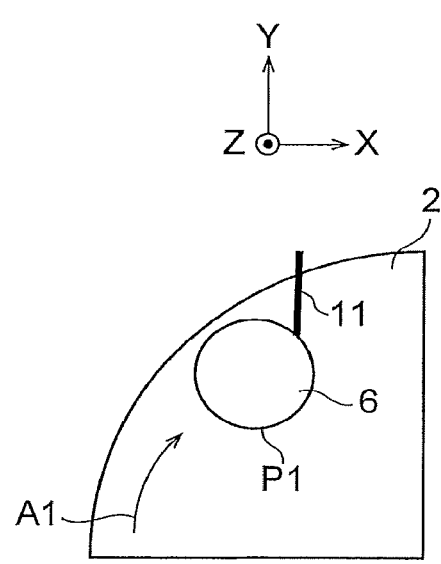

FIGS. 4A and 4B are other top views for explaining operation of the semiconductor manufacturing apparatus of the first embodiment.

The partition portion 11 in FIG. 4A is located on the upstream side of the rotation direction (A1) of the polishing pad 2 from the heat exchanger 6. On the other hand, the partition portion 11 in FIG. 4B is located on the downstream side of the rotation direction (A1) of the polishing pad 2 from the heat exchanger 6. Both the partition portions 11 provide effects of causing the slurry to flow into the area between the polishing pad 2 and the heat exchanger 6, as described above with reference to FIGS. 3A and 3B. Therefore, the partition portions 11 may be provided at the upstream side from the heat exchanger 6, or may be provided at the downstream side from the heat exchanger 6.

Figure 5A:
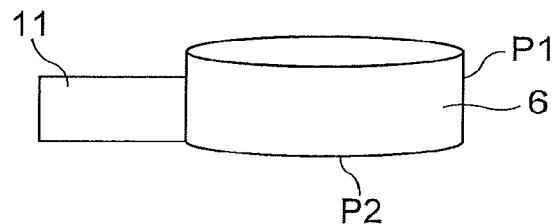
FIGS. 5A to 5C are perspective views showing structural examples of the heat exchanger of the first embodiment.
Figure 5B:
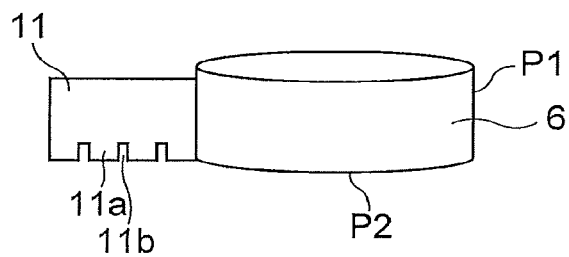
Figure 5C:
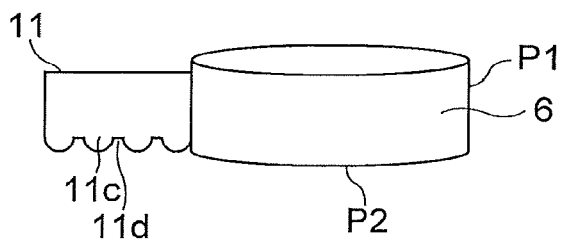

FIGS. 5A to 5C are perspective view showing structural examples of the heat exchanger 6 of the first embodiment.

The partition portion 11 in FIG. 5A has a flat bottom face. On the other hand, the partition portion 11 in FIG. 5B has a bottom face provided with rectangular convex portions 11a and rectangular concave portions 11b. Further, the partition portion 11 in FIG. 5C has a bottom face provided with curved convex portions 11c and curved concave portions 11d. As shown in these drawings, the bottom face of each of the partition portions 11 may be a flat face or a non-flat face.

The structure in FIG. 5A can be adopted when a large space between the upper face of the polishing pad 2 and the bottom face of the partition portion 11 is not desired, for example. On the other hand, the structures in FIGS. 5B and 5C can be adopted when the partition portion 11 is desired to be prevented from being fitted in a trench in the upper face of the polishing pad 2, or when the resistance of the partition portions 11 is desired to be reduced, for example.

Figure 6A:
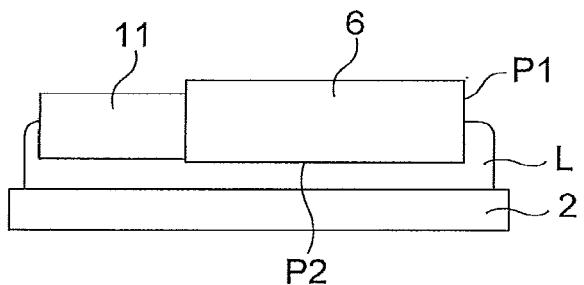
FIGS. 6A and 6B are side views showing the structural examples of the heat exchanger of the first embodiment.
Figure 6B:
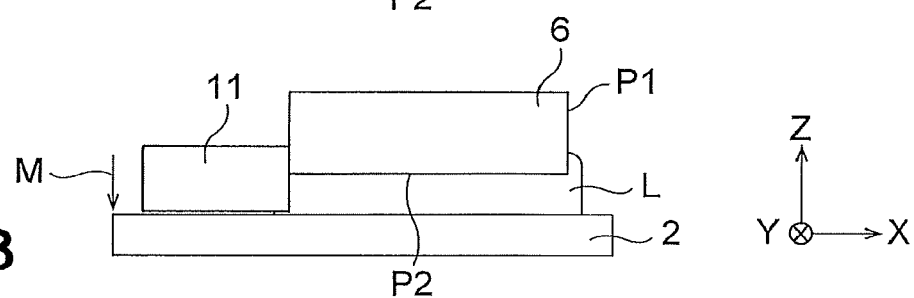

FIGS. 6A and 6B are side views showing structural examples of the heat exchanger 6 of the first embodiment.

The partition portion 11 in FIG. 6A is fixed to the side face P1 of the heat exchanger 6. On the other hand, the partition portion 11 in FIG. 6B is attached to the heat exchanger 6 so as to be movable in the vertical direction (±Z direction) relative to the heat exchanger 6. Arrow M indicates a state in which the partition portion 11 is moving downward relative to the heat exchanger 6. Reference character L indicates the slurry on the polishing pad 2.

When the space between the polishing pad 2 and the partition portion 11 is narrowed, as shown in FIG. 6B, the slurry hardly passes through an area below the partition portion 11 so that the slurry is more likely to enter the area between the polishing pad 2 and the heat exchanger 6. However, in some cases, the space between the polishing pad 2 and the partition portion 11 is desired to be wider than that in the state in FIG. 6B. According to the partition portion 11 in FIG. 6A, the size of such a space can be freely changed. The movement of the partition portion 11 can be controlled via the arm for the heat exchanger 6, for example.

As described above, the semiconductor manufacturing apparatus of the present embodiment includes one or more partition portions 11 provided on the side face P1 of the heat exchanger 6. Accordingly, according to the present embodiment, the slurry can easily enter the area between the polishing pad 2 and the heat exchanger 6.

Second Embodiment

FIGS. 7A to 7D are a side view and perspective views showing the structures of the heat exchanger 6 of a second embodiment. Similar to the heat exchanger 6 of the first embodiment, the heat exchanger 6 of the present embodiment is provided in the semiconductor manufacturing apparatus in FIG. 1.

Figure 7A:
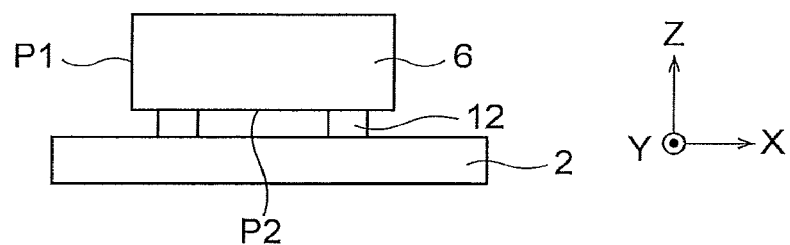
FIGS. 7A to 7D are a side view and perspective views showing the structures of a heat exchanger of a second embodiment.

The side view in FIG. 7A shows one or more projecting portions 12 provided on the bottom face P2 of the heat exchanger 6. Each of the projecting portions 12 is an example of the protruding portion, and protrudes downward from the bottom face P2 of the heat exchanger 6. The heat exchanger 6 may be provided with the partition portions 11 in addition to the projecting portions 12.

According to the present embodiment, a space between the polishing pad 2 and the heat exchanger 6 is formed by the projecting portions 12 so that the slurry easily enters the area between the polishing pad 2 and the heat exchanger 6. Consequently, the temperature of the polishing pad 2 and the temperature of the slurry can be efficiently controlled, as in the first embodiment.

In addition, according to the present embodiment, because of the presence of the projecting portions 12 on the bottom face P2 of the heat exchanger 6, occurrence of a state (hydroplaning) in which the heat exchanger 6 is floating on the slurry is easily caused. This state also facilitates entry of the slurry into the area between the polishing pad 2 and the heat exchanger 6. Consequently, the temperature of the polishing pad 2 and the temperature of the slurry can be more efficiently controlled.

For example, the thickness (the dimension in the Z direction) of each of the projecting portions 12 is 50 to 100 µm with respect to the bottom face P2 of the heat exchanger 6. Moreover, regarding the shapes or arrangement of the projecting portions 12, various forms can be adopted. For example, shapes and arrangements shown in FIG. 7B to 7D can be adopted.

Figure 7B:
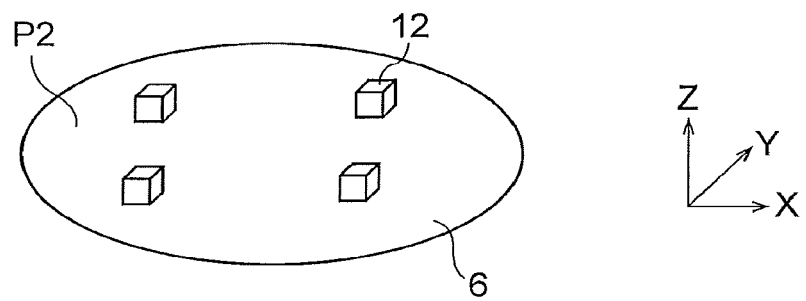
Figure 7C:
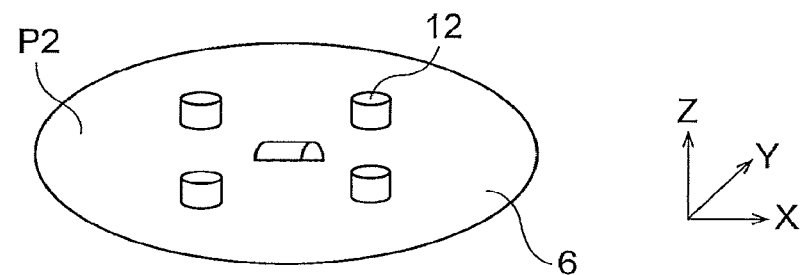
Figure 7D:
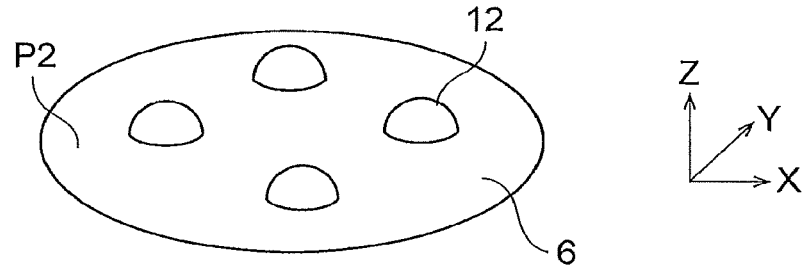

The perspective views in FIGS. 7B to 7D each show the bottom face P2 of the heat exchanger 6 in an upside down state. The projecting portions 12 in FIG. 7B each have a cubic shape. The projecting portions 12 in FIG. 7C each have a cylindrical shape or a semicylindrical shape. The projecting portions 12 in FIG. 7D each have a hemispherical shape. As shown in these drawings, the projecting portions 12 provided on the heat exchanger 6 may have the same shape or may have two or more types of shapes. The projecting portions 12 provided on the heat exchanger 6 may be regularly arranged, or may be irregularly arranged.

The projecting portions 12 may be produced by any method. For example, the projecting portions 12 may be fastened to the bottom face P2 of the heat exchanger 6 via fastening tools such as screws. Alternatively, a casing of the heat exchanger 6 and the projecting portions 12 may be formed with use of the same mold. The raw material of the projecting portions 12 of the present embodiment is SiC (silicon carbide), the same as the raw material of the bottom face P2 of the heat exchanger 6.

In the present embodiment, the bottom face P2 of the heat exchanger 6 has a circular shape, and the area "Sa" of the bottom face P2 is $\pi r^2$ ("r" represents the radius of the bottom face P2). On the other hand, in the bottom face P2 of the heat exchanger 6 in FIG. 7B, the area "Sb" of a region where the four projecting portions 12 are provided is $4a^2$ ("a" represents the length of one side of the projecting portion 12). The ratio of the region where the projecting portions 12 are provided on the bottom face P2 of the heat exchanger 6 of the present embodiment, that is, the ratio of Sb to Sa is preferably less than 50%. This can be expressed by a formula: Sb/Sa<0.5. The same applies to the heat exchanger 6 in FIG. 7C and the heat exchanger 6 in FIG. 7D. The value of Sb/Sa in each of FIG. 7B to 7D is preferably 0.02 to 0.1 (2 to 10%), for example.

A smaller value of Sb/Sa has an advantage that a contact area between the polishing pad 2 and the projecting portions 12 becomes smaller, for example. Accordingly, the slurry is more likely to enter the area between the polishing pad 2 and the heat exchanger 6.

Figure 8A:
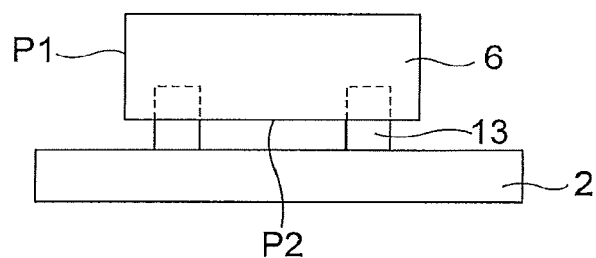
FIGS. 8A and 8B are side views each showing the structure of a heat exchanger of a first modification of the second embodiment.
Figure 8B:
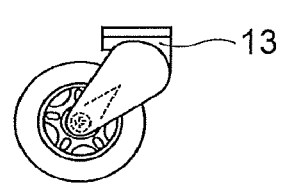
Figure 9A:
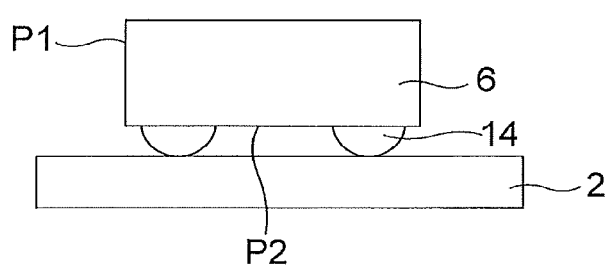
FIGS. 9A and 9B are a side view and a perspective view each showing the structure of a heat exchanger of a second modification of the second embodiment.
Figure 9B:
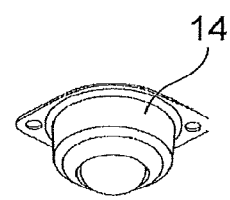

FIGS. 8A and 8B are side views each showing the structure of the heat exchanger 6 according to a first modification of the second embodiment. FIGS. 9A and 9B are a side view and a perspective view each showing the structure of the heat exchanger 6 according to a second modification of the second embodiment.

In the first modification, projecting portions 13 which are single-wheel casters each being rotatable in a specific direction are provided in place of the aforementioned projecting portions 12. In the second modification, projecting portions 14 which are spherical casters each being rotatable in an arbitrarily defined direction are provided in place of the aforementioned projecting portions 12. According to these modifications, for example, when the heat exchanger 6 is moved on the polishing pad 2, the projecting portions 13, 14 can be inhibited from damaging the polishing pad 2. Alternatively, other rotatable projecting portions (e.g., rollers) may be provided in place of the aforementioned projecting portions 12.

Figure 10A:
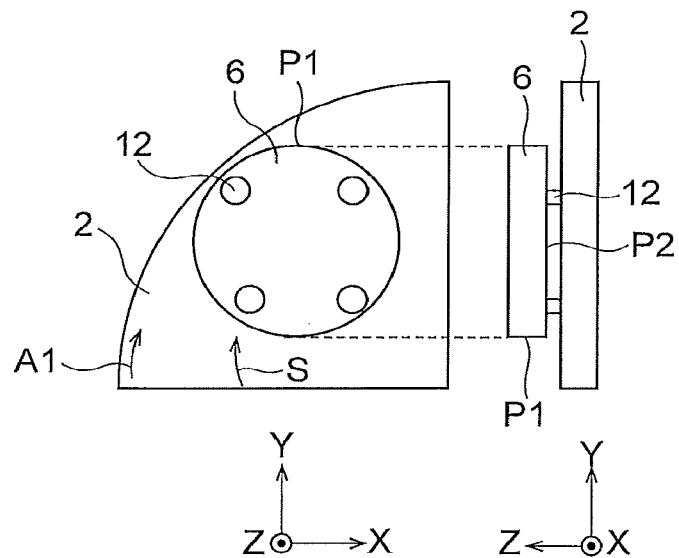
FIGS. 10A and 10B are top views and side views showing examples of a set state of the heat exchanger of the second embodiment.
Figure 10B:
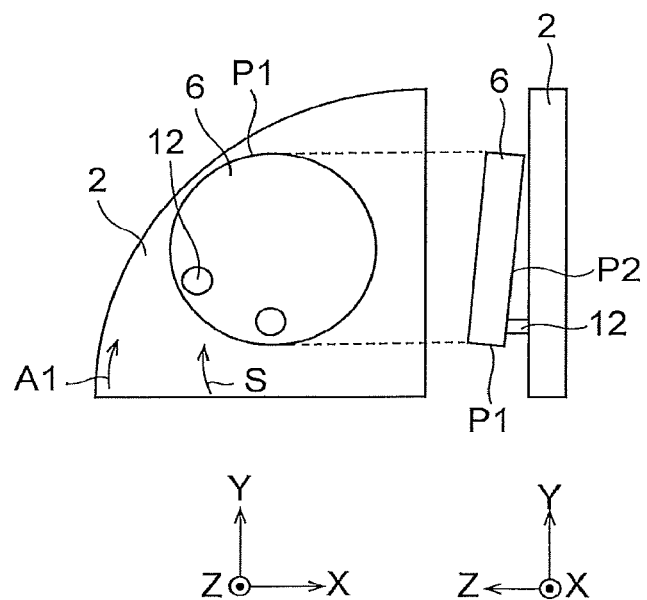

FIGS. 10A and 10B are top views and side views showing examples of the set state of the heat exchanger 6 of the second embodiment.

The top view and the side view in FIG. 10A show a first example of the set state of the heat exchanger 6, and the top view and the side view in FIG. 10B show a second example of the set state of the heat exchanger 6. In these top views, the attachment positions of the projecting portions 12 relative to the bottom face P2 of the heat exchanger 6 are shown to make the description easy to understand.

In FIG. 10A, the four projecting portions 12 are evenly provided on the bottom face P2 of the heat exchanger 6. As a result, the entire bottom face P2 of the heat exchanger 6 is floating relative to the polishing pad 2 so that the bottom face P2 is in non-contact with the upper face P1 of the polishing pad 2.

On the other hand, in FIG. 10B, the two projecting portions 12 are unevenly provided on the bottom face P2 of the heat exchanger 6. As a result, only the upstream portion of the bottom face P2 of the heat exchanger 6 is floating relative to the polishing pad 2, while the downstream portion thereof is in contact with the upper face P1 of the polishing pad 2.

In the case of FIG. 10A, from any direction, the slurry easily flows into the area between the polishing pad 2 and the heat exchanger 6. On the other hand, in the case of FIG. 10B, from the upstream portion, the slurry easily flows into the area between the polishing pad 2 and the heat exchanger 6. However, the slurry is likely to reach the upstream portion from the outside of the space but is less likely to reach the downstream portion from the outside of the space. Therefore, the degree of easiness for the slurry to flow into the area in the case of FIG. 10B is substantially equal to that in the case of FIG. 10A. Therefore, either of the structures in FIG. 10A and 10B may be adopted in the present embodiment.

Figure 11A:
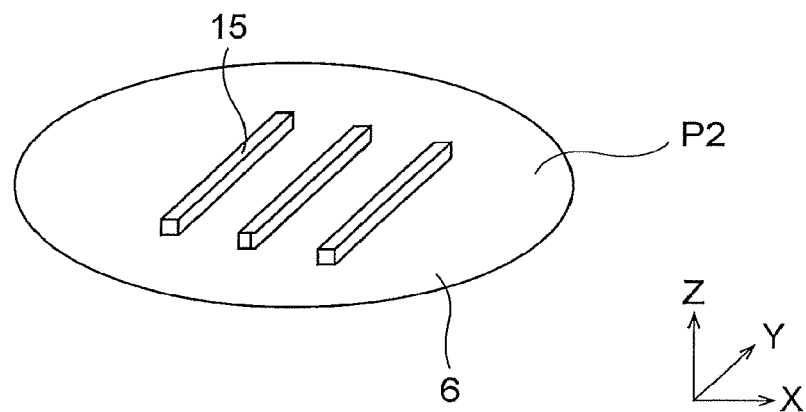
FIGS. 11A and 11B are a perspective view and a top view each showing the structure of a heat exchanger of a third modification of the second embodiment.
Figure 11B:
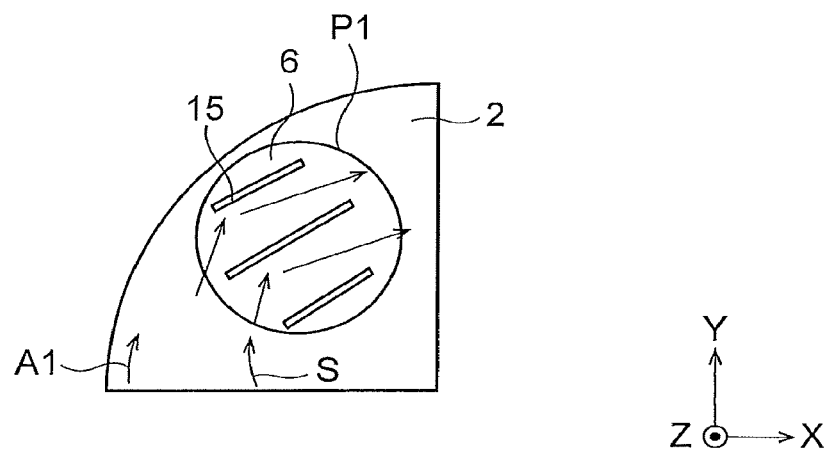

FIGS. 11A and 11B are a perspective view and a top view each showing the structure of the heat exchanger 6 of a third modification of the second embodiment.

In the third modification, projecting portions 15 are provided in place of the aforementioned projecting portions 12, as shown in the perspective view in FIG. 11A. The perspective view in FIG. 11A shows the bottom face P2 of the heat exchanger 6 in an upside down state. The aforementioned projecting portions 12 each have a substantially dot-like planar shape (FIG. 7B to 7D), while the projecting portions 15 of the third modification each have a substantially linear planar shape (FIG. 11A). The projecting portions 15 each have a linear shape extending along the bottom face P2 of the heat exchanger 6.

In order to make the explanation easy to understand, the top view in FIG. 11B shows the attachment positions of the projecting portions 15 relative to the bottom face P2 of the heat exchanger 6. According to the present modification, the flow direction of the slurry can be controlled by means of the projecting portions 15 each linearly extending. FIG. 11B shows the state in which the slurry flowing toward the outer circumference of the polishing pad 2 is returned to the center portion of the polishing pad 2 by means of the projecting portions 15.

As described above, the semiconductor manufacturing apparatus of the present embodiment includes one or more projecting portions 12 to 15 provided on the bottom face P2 of the heat exchanger 6. Consequently, according to the present embodiment, the slurry can easily enter the area between the polishing pad 2 and the heat exchanger 6.

Third Embodiment

Figure 12:
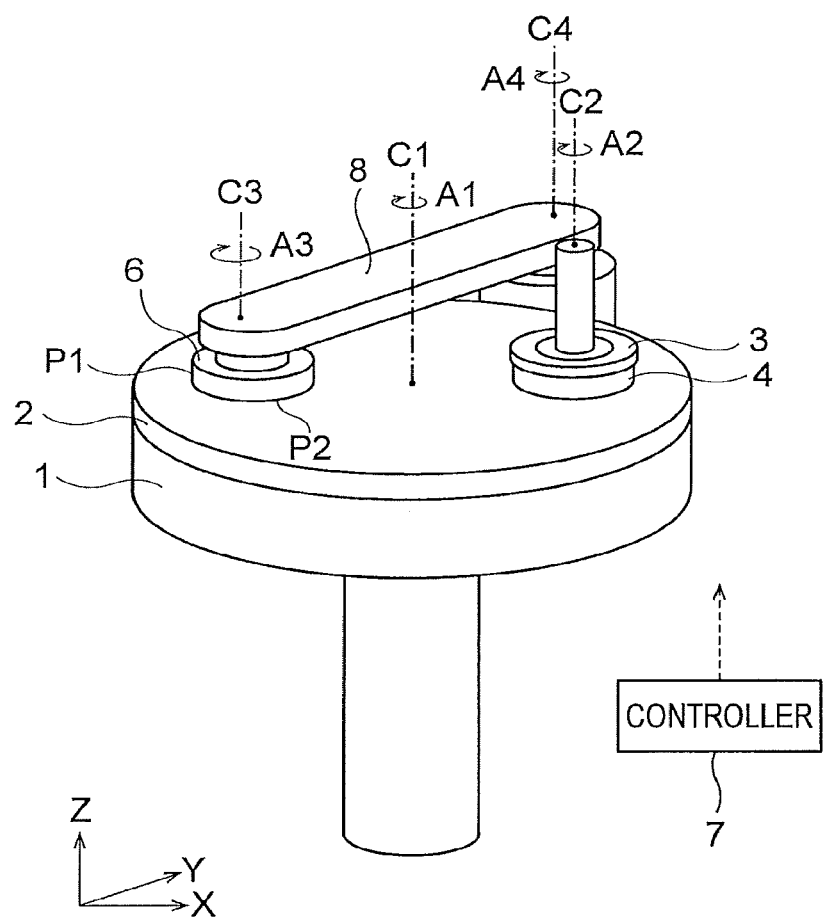
FIG. 12 is a perspective view showing the structure of a semiconductor manufacturing apparatus of a third embodiment.

FIG. 12 is a perspective view showing the structure of a semiconductor manufacturing apparatus of a third embodiment.

The semiconductor manufacturing apparatus in FIG. 12 includes an arm 8 for the heat exchanger 6 in addition to the components shown in FIG. 1. The arm 8 holds the heat exchanger 6, and is capable of causing the heat exchanger 6 to oscillate or causing the heat exchanger 6 to turn. Operation of the arm 8 is controlled by the controller 7. The arm 8 of the present embodiment may be applied to the heat exchanger 6 of the first embodiment, or may be applied to the heat exchanger 6 of the second embodiment.

By rotating about the rotation axis C3, the arm 8 can move the heat exchanger 6 on the polishing pad 2 or oscillate the heat exchanger 6 on the polishing pad 2, as indicated by arrow A3. In addition, the arm 8 can rotate (turn) the heat exchanger 6 about a rotation axis C4, as indicated by arrow A4. In these cases, provision of the projecting portions 13, 14, which are casters, on the bottom face P2 of the heat exchanger 6 further facilitates oscillation or turning of the heat exchanger 6.

According to the present embodiment, by oscillation or turning of the heat exchanger 6, the temperature of the polishing pad 2 and the temperature of the slurry can be more uniformly controlled or a flow of the slurry can be caused, for example.

In the first to third embodiments having been described above, the heat exchanger 6 heats the polishing pad 2 and the slurry. However, if the polishing pad 2 and the slurry are desired to be cooled, the polishing pad 2 and the slurry may be cooled by the heat exchanger 6. That is, heat exchange carried out by the heat exchanger 6 may be used to heat the polishing pad 2 and the slurry, or may be used to cool the polishing pad 2 and the slurry.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a polishing table configured to hold a polishing pad;
   a polishing head configured to hold a substrate to be polished by the polishing pad;
   a polishing liquid feeder configured to feed a polishing liquid to the polishing pad;
   a heat exchanger configured to be placed on the polishing pad and control temperatures of the polishing pad and the polishing liquid; and
   one or more protruding portions provided on a side face or a bottom face of the heat exchanger.

2. The apparatus of claim 1, wherein the protruding portions have shapes linearly extending from the side face of the heat exchanger.

3. The apparatus of claim 2, wherein the protruding portions have planar shapes of straight lines, curved lines or bent lines.

4. The apparatus of claim 1, wherein the protruding portions are provided on the side face of the heat exchanger, and are provided at positions to come into contact with the polishing liquid fed to the polishing pad.

5. The apparatus of claim 1, wherein the protruding portions are provided on the side face of the heat exchanger, and are located on an upstream side of a rotation direction of the polishing pad from the heat exchanger.

6. The apparatus of claim 1, wherein the protruding portions are provided on the side face of the heat exchanger, and are located on a downstream side of a rotation direction of the polishing pad from the heat exchanger.

7. The apparatus of claim 1, wherein bottom faces of the protruding portions are flat faces.

8. The apparatus of claim 1, wherein at least one of the protruding portions includes a convex portion or a concave portion on the bottom face of the protruding portion.

9. The apparatus of claim 8, wherein the at least one of the protruding portions alternately includes a plurality of convex portions and a plurality of concave portions on the bottom face of the protruding portion.

10. The apparatus of claim 1, wherein the protruding portions are provided on the heat exchanger so as to be movable in a vertical direction relative to the heat exchanger.

11. A method of manufacturing a semiconductor device, comprising:
   holding a polishing pad by a polishing table;
   feeding a polishing liquid to the polishing pad;
   placing, on the polishing pad, a heat exchanger provided with one or more protruding portions on a side face or a bottom face thereof;
   controlling temperatures of the polishing pad and the polishing liquid by the heat exchanger; and
   polishing a substrate by the polishing pad on which the polishing liquid is fed.

12. The method of claim 11, wherein the protruding portions have shapes linearly extending from the side face of the heat exchanger.

13. The method of claim 12, wherein the protruding portions have planar shapes of straight lines, curved lines or bent lines.

14. The method of claim 11, wherein the protruding portions are provided on the side face of the heat exchanger, and are provided at positions to come into contact with the polishing liquid fed to the polishing pad.

15. The method of claim 11, wherein the protruding portions are provided on the side face of the heat exchanger, and are located on an upstream side of a rotation direction of the polishing pad from the heat exchanger.

16. The method of claim 11, wherein the protruding portions are provided on the side face of the heat exchanger, and are located on a downstream side of a rotation direction of the polishing pad from the heat exchanger.

17. The method of claim 11, wherein bottom faces of the protruding portions are flat faces.

18. The method of claim 11, wherein at least one of the protruding portions includes a convex portion or a concave portion on the bottom face of the protruding portion.

19. The method of claim 18, wherein the at least one of the protruding portions alternately includes a plurality of convex portions and a plurality of concave portions on the bottom face of the protruding portion.

20. The method of claim 11, wherein the protruding portions are provided on the heat exchanger so as to be movable in a vertical direction relative to the heat exchanger.

\* \* \* \* \*